United States Patent
Van Der Laan et al.

(10) Patent No.: US 6,940,587 B2
(45) Date of Patent: Sep. 6, 2005

(54) LITHOGRAPHIC APPARATUS AND A MEASUREMENT SYSTEM

(75) Inventors: Hans Van Der Laan, Veldhoven (NL); Johannes Jacobus Matheus Baselmans, Oirschot (NL); Antonius Johannes Josephus Van Dijsseldonk, Hapert (NL); Martinus Hendrikus Antonius Leenders, Rotterdam (NL); Johannes Hubertus Josephina Moors, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 60 days.

(21) Appl. No.: 10/670,801

(22) Filed: Sep. 26, 2003

(65) Prior Publication Data

US 2004/0114119 A1 Jun. 17, 2004

(30) Foreign Application Priority Data

Sep. 30, 2002 (EP) .............................. 02256794

(51) Int. Cl.$^7$ ..................... G03B 27/52; G03B 27/54; G03B 27/68
(52) U.S. Cl. ..................... 355/67; 355/52; 355/55
(58) Field of Search ..................... 355/52, 53, 55, 355/67, 68, 71

(56) References Cited

U.S. PATENT DOCUMENTS

| 6,650,399 B2 | * | 11/2003 | Baselmans et al. ........... 355/55 |
| 2002/0145717 A1 | | 10/2002 | Baselmans et al. ........... 355/55 |

FOREIGN PATENT DOCUMENTS

| DE | 10109929 A1 | 11/2001 |
| EP | 0961149 A2 | 12/1999 |
| EP | 1231514 A1 | 8/2002 |

OTHER PUBLICATIONS

European Search Report dated Jul. 31, 2003.

* cited by examiner

*Primary Examiner*—Rodney Fuller
(74) *Attorney, Agent, or Firm*—Pillsbury Winthrop Shaw Pittman, LLP

(57) ABSTRACT

A measurement system configured to measure wave front aberrations of a projection system, as well as a lithographic apparatus including such a measurement system, is provided wherein the measurement system includes a diffractive element and structure configured to increase the pupil filling of the radiation in the pupil of the projection system, both movable into the projection beam between a radiation system and the projection system, and a sensor module configured to sense radiation that has traversed the projection system to measure wave front aberrations of the projection system.

29 Claims, 3 Drawing Sheets

LITHOGRAPHIC APPARATUS AND A MEASUREMENT SYSTEM

This application claims priority from European patent application EP 02256794.5, filed Sep. 30, 2002, herein incorporated by reference in its entirety.

FIELD

The present invention relates to the measurement of wave front aberrations in a lithographic projection apparatus.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure maybe embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which maybe fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

There is a desire to integrate an ever-increasing number of electronic components in an IC. To realize this it is necessary to decrease the size of the components and therefore to increase the resolution of the projection system, so that increasingly smaller details, or line widths, can be projected on a target portion of the substrate. For the projection system this means that the projection system and the lens elements used in the projection system must comply with very stringent quality requirements. Despite the great care taken during the manufacturing of lens elements and the projection system, they both may still suffer from wave front aberrations, such as, for example, displacement, defocus, astigmatism, coma and spherical aberration across an image field projected with the projection system on to a target portion of the substrate. Such aberrations are important sources of variations of the imaged line widths occurring across the image field. It is important that the imaged line widths at different points within the image field are constant. If the line width variation is large, the substrate on which the image field is projected may be rejected during a quality inspection of the substrate. Using techniques such as phase-shifting masks, or off-axis illumination, the influence of wave front aberrations on the imaged line widths may further increase.

During manufacturing of a lens element it is advantageous to measure the wave front aberrations of the lens element and to use the measured results to tune the aberrations in this element or even to reject this element if the quality is not sufficient. When the lens elements are put together to form the projection system it may again be necessary to measure the wave front aberrations of the projection system. These measurements maybe used to adjust the position of certain lens elements in the projection system in order to minimize wave front aberrations of the total projection system.

After the projection system has been built into a lithographic projection apparatus, the wave front aberrations may be measured again. Moreover, since wave front aberrations are variable in time in a projection system, for instance, due to deterioration of the lens material or lens heating effects (local heating of the lens material), it may be necessary to measure the aberrations at certain instants in time during operation of the apparatus and to adjust certain moveable lens elements accordingly to minimize wave front aberrations. The short time scale, on which lens-heating effects may occur, may require measuring the wave front aberrations frequently.

Previously there has been proposed a measurement system for measuring wave front aberrations of a projection system using the principle known as a "shearing interferometer". According to this proposal different portions of the projection beam from a particular location at the level of the patterning device, travel along different paths through the projection lens. This can be achieved by a diffractive element located in the projection beam between the radiation system and the projection system. The diffractive element, such as a grating, also known as the object grating, diffracts the radiation and spreads it out such that it passes through the projection system along a plurality of different paths. Light that has traversed the projection system then impinges on a further diffractive element, such as a pinhole or a grating, known as the image grating. This further diffractive element acts as the "shearing mechanism" which combines radiation from multiple paths through the lens to get interference, for example interference of different diffracted orders from different paths through the lens. For example the zero order from one path may be made to interfere with the first order from another path. This results in a diffraction pattern, which can be detected by a sensor to reveal information on the wave front aberration at a particular location in the image field.

However, there is a problem, particularly for some types of radiation, in spreading the radiation such that it fills the entire pupil of the projection lens (filling the pupil of the projection lens corresponds to incoherent light, i.e. the light entering the projection lens having no particular angular bias). If the radiation does not adequately fill the pupil of the projection lens, then the aberration of the lens is not necessarily accurately measured, because it is only sampled for particular paths of radiation through the lens. If there is not a sufficient degree of pupil filing, then higher order aberrations cannot be measured at all.

A further problem is as follows. Previously, it has also been proposed to measure defocus by projecting images of two alignment marks, one of which is telecentric and the other of which is non-telecentric. The distance between the images of the marks is known for the correct distance between the reticle and substrate. However, because one beam is non-telecentric, if the substrate is at the wrong height (i.e. not at the best focus position) then the distance between the marks will be different. In fact the amount of lateral shift of the non-telecentric mark is directly proportional to the amount of defocus. For radiation such as DUV, the method of generating the mark that produces the non-telecentric beam is to attach wedges, prisms or similar structures onto the reticle mask. However there is a problem that this cannot be done for a reflective EUV mask.

Accordingly, it would be advantageous to provide a measurement system for measuring the wave front aberrations in a lithographic projection apparatus, which alleviates, at least partially, any of the above problems.

SUMMARY

According to an aspect of the present invention, there is provided a lithographic projection apparatus comprising:
  a radiation system for providing a projection beam of radiation;
  a support structure for supporting patterning device, the patterning device serving to pattern the projection beam according to a desired pattern;
  a substrate table for holding a substrate;
  a projection system for projecting the patterned beam onto a target portion of the substrate; and
  a measurement system comprising:
    a diffractive element and a structure for increasing the pupil filling of the radiation in the pupil of the projection system, both movable into the projection beam between the radiation system and the projection system, and a sensor module for sensing radiation that has traversed the projection system for measuring wave front aberrations of the projection system.

This lithographic apparatus is advantageous because increasing the pupil filling can permit higher order aberrations of the projection system to be measured, and can improve the overall measurement of aberration.

In an embodiment, the structure for increasing the pupil filling comprises a structure for diffusing the radiation. This is advantageous because the structure for diffusing the radiation reduces the coherence of the radiation and improves the filling of the pupil of the projection system.

According to an embodiment, a single member has the function of both the diffractive element and the structure for diffusing the radiation. This has the advantage that there is no extra overhead in including the diffusing structure in the measurement system. The provision of the two functions may be combined in and/or on a single surface of the member. For example, the surface may be provided with a radiation diffracting structure embodied as a grating and a surface-structure for diffusing by diffracting or scattering radiation for improving filling of the pupil of the projection system.

The diffractive element may comprise a reflective grating in which the reflective portions comprise a structure for diffusing the radiation. The structure for diffusing the radiation may comprise an array of reflective portions randomly staggered in height. This structure advantageously acts as a random phase diffuser and can substantially fill the pupil of the projection system. Each reflective portion may comprise a multi layer structure, which advantageously can function as a reflector for EUV radiation.

The structure for diffusing the radiation may comprise sub-resolution absorptive features, such as a random array of absorptive dots, which can advantageously diffuse the radiation by random amplitude modulation.

According to an embodiment, the diffractive element comprises a transmissive grating, and the measurement system further comprises a mirror for directing the projection beam to illuminate the grating from behind, wherein the structure for diffusing the radiation comprises imperfections in the mirror. Preferably the mirror is curved to provide a focusing effect. This has the advantage of increasing the intensity of the radiation sensed by the sensor module thereby improving the signal to noise ratio of the interferogram and reducing the time required to collect the data for measuring the aberration.

According to a further embodiment, the diffractive element comprises a transmissive grating, and the measurement system further comprises a mirror for directing the projection beam to illuminate the grating from behind, wherein the mirror is curved to provide a focusing effect and comprises the structure for increasing the pupil filling of the radiation in the pupil of the projection system.

Another aspect of the invention provides a lithographic projection apparatus comprising:

a radiation system for providing a projection beam of radiation;

a support structure for supporting patterning device, the patterning device serving to pattern the projection beam according to a desired pattern;

a substrate table for holding a substrate;

a projection system for projecting the patterned beam onto a target portion of the substrate, and a measurement system for measuring defocus of the apparatus, comprising a transmissive grating and a mirror for directing the projection beam to illuminate the grating from behind, wherein, in use, the mirror is tilted at an angle relative to the plane of the grating to provide a tilted illumination beam.

A further aspect of the present invention provides a measurement system for measuring wave front aberrations of a projection system, said measurement system comprising:

a radiation system for providing a projection beam of radiation; and a projection system holder for holding a projection system in the projection beam such that the projection system is illuminated by the projection beam;

a diffractive element and a structure for increasing the pupil filling of the radiation in the pupil of the projection system, both movable into the projection beam between the radiation system and the projection system; and a sensor module for sensing radiation that has traversed the projection system for measuring wave front aberrations of the projection system.

With this system it is possible during the manufacturing of lens elements to measure more accurately the wave front aberrations of a single lens element and consequently to choose this element or even to reject it if the quality is not sufficient. It is also possible to measure more accurately the wave front aberrations of a projection system wherein different lens elements are put together. The results of such measurement may be used to adjust certain lens elements to minimize the wave front aberrations.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiment 1

Figure 1:
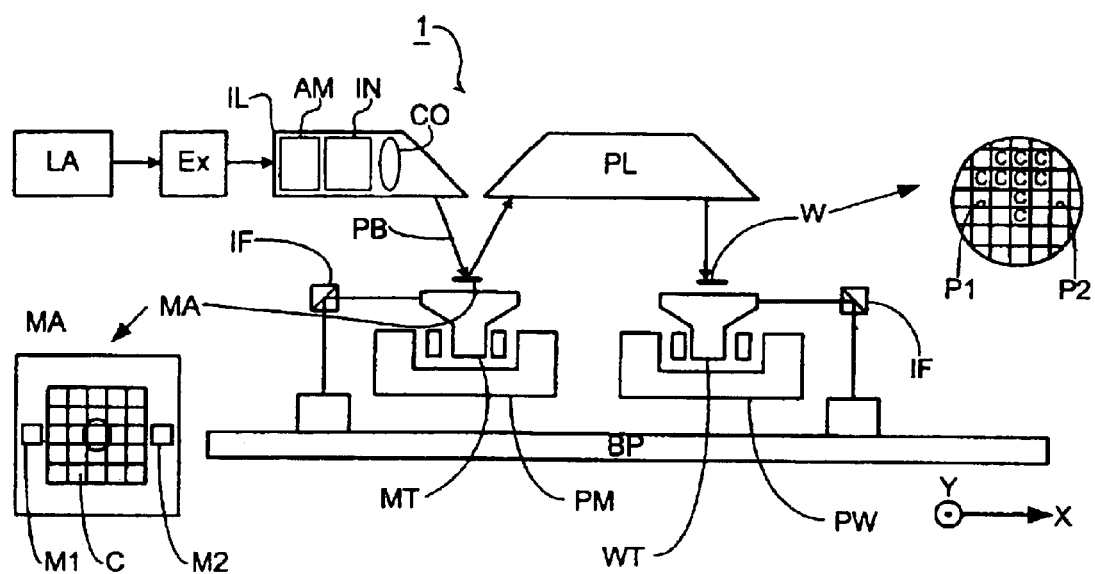
FIG. 1 depicts a lithographic projection apparatus according to an embodiment of the invention.

FIG. 1 schematically depicts a lithographic projection apparatus according to a particular embodiment of the invention. The apparatus comprises:

- a radiation system Ex, IL, for supplying a projection beam PB of radiation (e.g. EUV radiation), which in this particular case also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. mirror group) for imaging an irradiated portion of the mask MA onto a target portion C (e.g. comprising one or more dies) of the substrate W.

As here depicted, the apparatus is of a reflective type (e.g. has a reflective mask). However, in general, it may also be of a transmissive type, for example (e.g. with a transmissive mask). Alternatively, the apparatus may employ another kind of patterning device, such as a programmable mirror array of a type as referred to above.

The source LA (e.g. a laser-produced or discharge plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
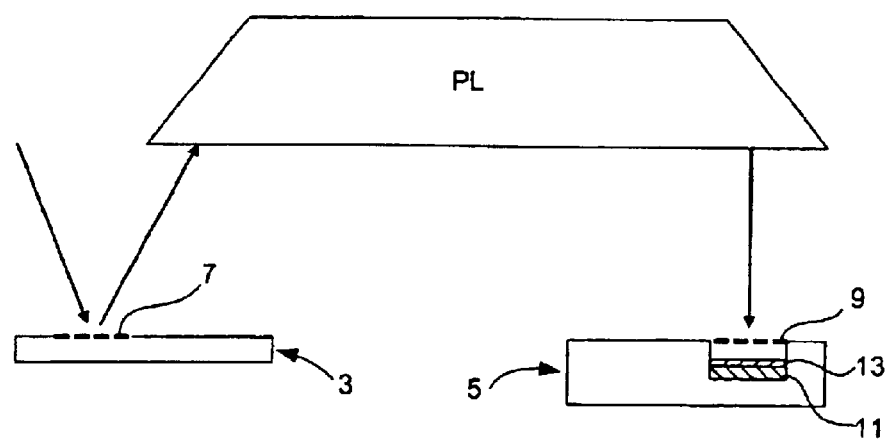
FIG. 2 depicts an embodiment of a wave front aberration measuring system incorporated in the lithographic projection apparatus of FIG. 1.

FIG. 2 shows a wave front aberration measurement system incorporated in the lithographic projection apparatus of FIG. 1. Only a portion of the lithographic projection apparatus is shown in FIG. 2, and this portion includes the projection system PL. The measurement system comprises a grating module 3 and a sensor module 5. The grating module 3 may be put on the mask table MT occasionally, or may form a part of said table, and comprises an object grating 7. The sensor module 5 may be put on the substrate table WT occasionally or may form a part of said substrate table WT, and comprises an image grating 9, which is a transmission grating, a detector 11 and a luminescent layer 13. The image grating 9 corresponds to the object grating 7, but scaled by the magnification M of the projection system PL mentioned above. The detector 11 can be a CCD chip and the luminescent layer 13 converts incident radiation from the projection beam, such as EUV radiation, to radiation to which the detector 11 is more sensitive, such as visible light. Depending on the particular radiation and sensitivity of the detector 11, the luminescent layer 13 is optional and can be omitted.

Figure 3:
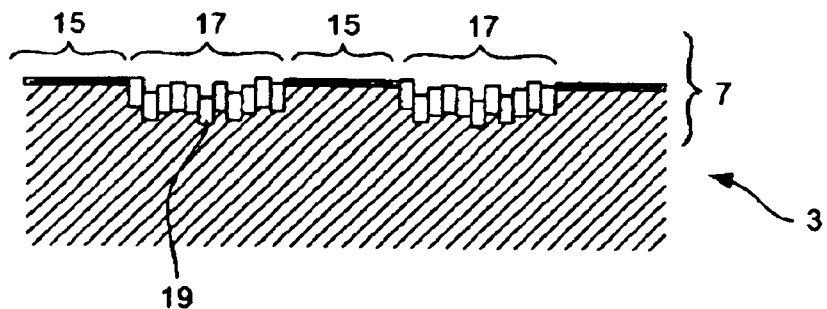
FIG. 3 is a detailed cross-section of a portion of an object grating for use in one embodiment of the present invention.

FIG. 3 shows an enlarged view of the grating module 3. The object grating 7 in this embodiment is a reflection grating comprising non-reflective regions 15 alternating with reflective regions 17. The grating can be a 1D grating or a 2D grating, or indeed more than one differently orientated 1D grating can be provided. In this illustrated embodiment, the reflective regions 17 have a structure for diffusing the radiation, which structure comprises a multi-layer structure provided on a substrate of non-uniform height such that within each reflective region 17 there are reflective portions 19 which are randomly staggered in height. This diffuses the radiation by altering the relative phase of the radiation reflected from different portions 19 of the reflective regions 17. In this way substantially complete filling of the pupil of the projection system is achieved.

The diffusing structure can be fabricated firstly by providing a specially engineered substrate. One way of doing this at the scale required is by electron beam writing. Another way of doing this is to expose the substrate to a cloud of normally distributed particles which adhere to the substrate to make it uneven. The multi-layer reflective structure is then grown on top of the specially engineered substrate. The reflective portions 19 have been described as being randomly staggered in height; it is to be understood that this could include a pseudo-random distribution and could also include a number of portions of the same height but spatially distributed randomly or pseudo-randomly, as well as encompassing a plurality of different random heights as illustrated in FIG. 3. After the multi-layer has been deposited on the substrate, the absorber for the non-reflective regions 15 can be deposited to define the grating.

In the following embodiments, only the main points of difference with respect to this first embodiment will be described for the sake of brevity and to avoid repetition.

Embodiment 2

An alternative to the structure for diffusing the radiation described above is to provide a grating in which the reflective regions may be of uniform height, but sub-resolution absorptive dots are scattered in a random or pseudo-random array in the reflective regions. These absorptive dots act as an amplitude diffuser. Although it is desired to produce a continuum of angles of radiation from the grating, this can be approximated as a discrete Fourier series as produced by scattering from the reflective regions with the array of sub-resolution absorptive dots.

Embodiments 3

Figure 4:
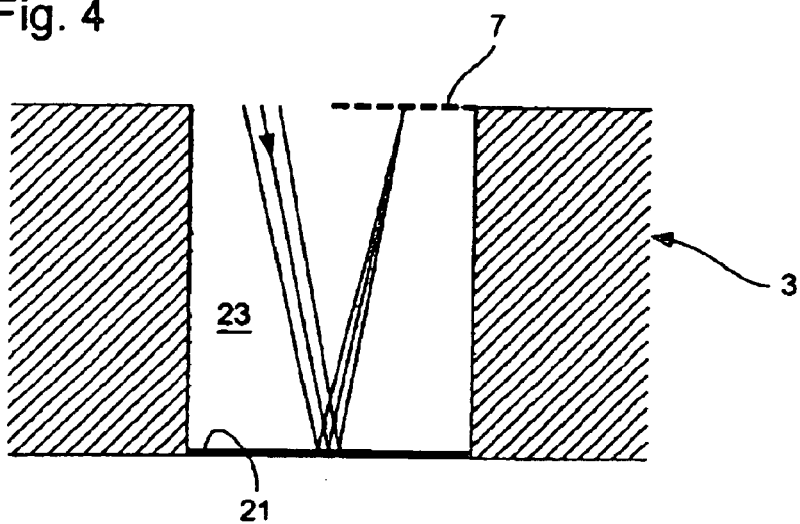
FIG. 4 is a cross-section of an object grating in a reticle module for use in another embodiment of the present invention.

FIG. 4 illustrates the grating module 3 according to this embodiment. The grating module 3 is preferably embodied in a removable reticle, but could, of course, be built into the mask table MT. It comprises an object grating 7 which is a transmission grating. Grating 7 is etched in a self-supporting membrane which is located over an opening 23 provided in the reticle. The opening has a depth of approximately 6 mm and a width of approximately 2 mm. A mirror 21 or equivalent reflective surface or structure is provided at the bottom of the opening. As shown in FIG. 4, light from the illuminator enters via the left side of the opening 23, is reflected by the mirror 21 and back-illuminates the grating 7 on the right side of the opening 23.

In this embodiment, the structure for diffusing the radiation can be implemented by roughening the surface of the mirror 21. In practice, for EUV radiation, even the best mirror finish will exhibit a large amount of scattering. Thus it may not be necessary specifically to roughen the surface, but simply polishing the surface of the mirror to a predetermined extent will produce a mirror that intrinsically acts as a diffuser. By choosing appropriate polishing tools, the mid spatial frequency range (MSFR, typically 1 mm to 1 $\mu$m) contribution can be increased which scatters predominantly in the forward direction, and thus acts as a diffusing mirror for EUV radiation. The diffusing functionality can also be achieved by applying to the mirror 21 phase or amplitude diffusing structures as described above for the reflective portions of the gratings in embodiments 1 and 2.

Embodiment 4

Figure 5:
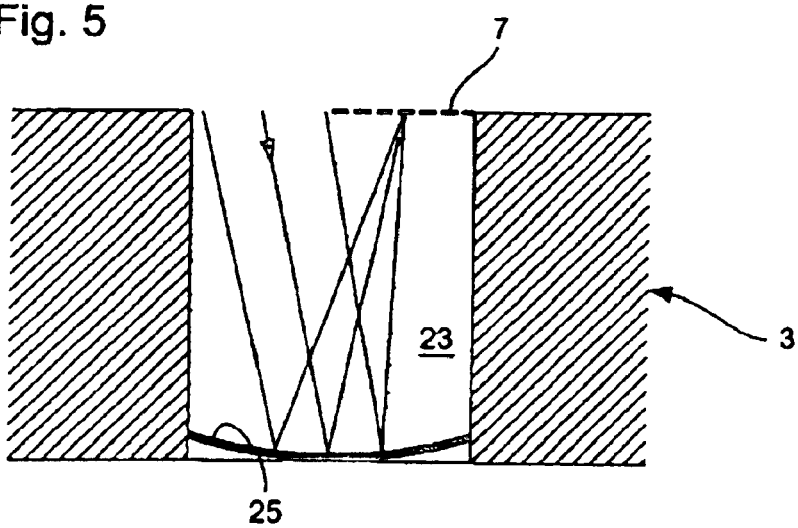
FIG. 5 is a cross-section of an object grating in a reticle module for use in a further embodiment of the present invention.

This embodiment, as illustrated in FIG. 5, is essentially the same as embodiment 3, except that the mirror 25 provided in the opening is a curved mirror such that it provides a focusing effect. In the case of a plane mirror 21, as in FIG. 4, there is no additional focusing effect (although the radiation is still converging on the grating 7 because it is focused by the illuminator). According to the present embodiment shown in FIG. 5, the curved mirror 25 can be in the form of a spherical mirror which can focus at least up to a factor of 4, which provides 16 times higher intensity before the incoming rays are blocked by the object grating 7. This increases the intensity of the interferogram to be measured and therefore improves the signal to noise ratio and can reduce the required scan time. By providing focusing, the curved mirror 25 can create portions of the radiation beam propagating at larger angles with respect to the optical axis and therefore increases the pupil filling. Consequently, the diffusing functionality is in principle not necessary. Thus the curved mirror can act as a structure for increasing the pupil filling of the radiation in the pupil of the projection system, either instead of, or in conjunction with, a diffusing structure.

The curved mirror 25 can, of course, also optionally provide the diffusing functionality as previously described for the mirror of embodiment 3. If there is some fine structure present in the radiation spot impinging on the object grating, it can be eliminated by a diffuser with a scatter angle small compared to diffusers of other embodiments.

Embodiment 5

Figure 6:
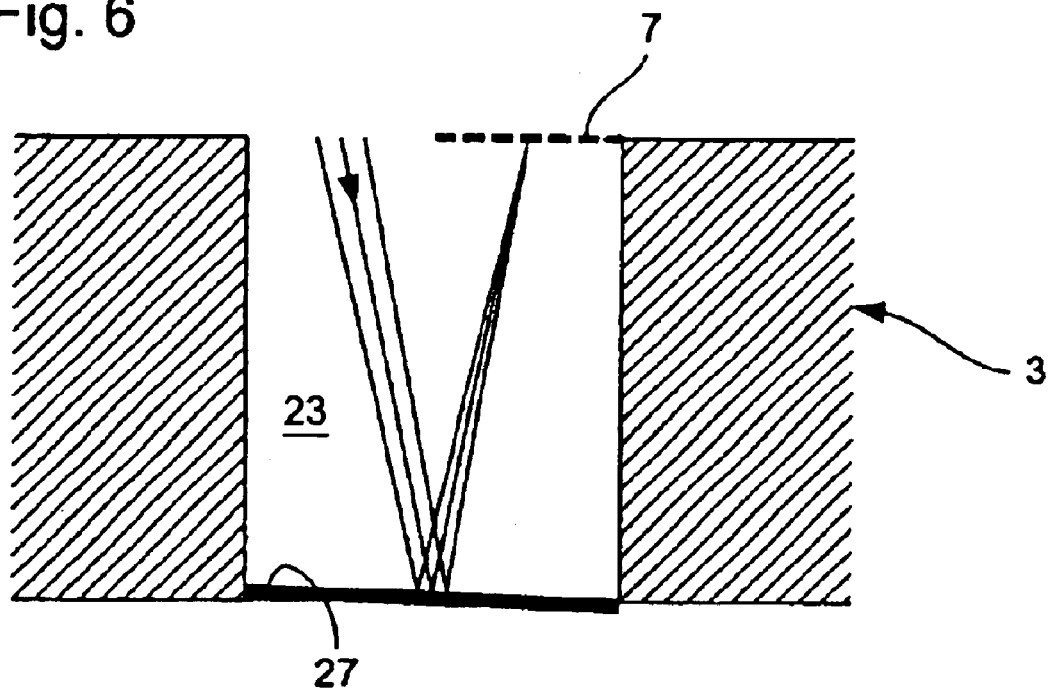
FIG. 6 is a cross-section of an object grating in a reticle module with a tilted mirror for use in another embodiment of the present invention.

In this embodiment, illustrated in FIG. 6, the details are the same as for embodiments 3 and 4, except that the mirror 27 is tilted such that it is inclined at an angle with respect to the plane of the grating 7. This produces tilted illumination. For example, by tilting the mirror by 1.5 degrees, an illumination tilt of 3 degrees is achieved. This enables a non-telecentric image to be projected using EUV radiation to enable defocus to be assessed. According to this embodiment, increase of pupil filling may also be provided although not necessary.

In a lithographic apparatus using a reflective mask, the illumination radiation must be incident on the mask at an angle. However, the illumination system is arranged so that the center of gravity of the angular distribution of the illumination radiation is located in the middle of the pupil of the projection system. Such an arrangement may be regarded as "untilted". The tilted illumination of this embodiment results in the center of gravity of the illumination radiation being displaced from the center of the pupil of the projection lens, leading to additional non-telecentricity at substrate level. That can be used to detect focus since with non-telecentricity at substrate, focus errors translate to position (overlay) errors that can be easily and accurately measured.

The mirror 27 can be plane or curved. One or more interchangeable grating modules 3 may be provided with a mirror 27 tilted by a respective predetermined angle. Alternatively, the mirror 27 of the grating module 3 may be adjustably tiltable by means of an actuator, such as a piezoelectric element, such that a desired angle of tilt or no tilt can be selected.

Embodiment 6

According to this embodiment, one or more Fresnel amplitude zone plates are placed in the radiation beam which is to be incident on the diffractive element. These zone plates can be used in conjunction with any of the above described embodiments to provide additional focusing power to increase the intensity of the interferogram with the attendant advantages mentioned above.

By providing focusing, the zone plate or plates can create portions of the radiation beam propagating at larger angles with respect to the optical axis and therefore increases the pupil filling. Thus the zone plates can act as a structure for increasing the pupil filling of the radiation in the pupil of the projection system, either instead of, or in conjunction with, a diffusing structure.

The zone plates are known from standard textbooks, such as "Optics" by Hecht. In one form they comprise annular zones which are alternately transmissive and nontransmissive. For the mth zone, the radius $R_m$ of the outer edge of that zone is given by:

$$R_m^2 = m r_0 \lambda$$

where $\lambda$ is the wavelength and $r_0$ is the focal length of the zone plate. For a focal length of 50 mm, and a wavelength in the EUV of 13.5 nm, the separation between the zones is approximately 10 $\mu$m. In this case the zone plates can be readily manufactured using photoreduction and etching in thin (approximately 10 $\mu$m) self-supporting metal plates.

Any unwanted phase relation introduced by the zone plate or plates is destroyed by a suitable diffusing structure, such as the random phase diffuser described above. Chromatic aberrations of the zone plates are also not relevant due to the diffusing structure.

A changer can be provided for removably inserting one or more zone plates into the illumination beam as desired when performing aberration measurements.

For all of the above-described embodiments, further details on how to perform the measurements on the wave front to determine the aberration, in step mode and in scan mode, are given in United States Patent Application Publication No. 2002/0145717, incorporated herein by reference.

While specific embodiments of the invention have been described above, it will be appreciated that the invention may be practiced otherwise than as described. The description is not intended to limit the invention.

What is claimed is:

1. A lithographic projection apparatus comprising:
   an illuminator configured to provide a projection beam of radiation;
   a support structure configured to hold a patterning device, the patterning device configured to pattern the projection beam according to a desired pattern;
   a substrate table configured to hold a substrate;
   a projection system configured to project the patterned beam onto a target portion of the substrate; and
   a measurement system comprising:
   a diffractive element and a diffuser structure configured to increase the pupil filling of the radiation in the pupil of the projection system relative to pupil filling of the radiation in the pupil of the projection system attributable to the diffractive element alone, both movable into the projection beam between a radiation system and the projection system, and
   a sensor module configured to sense radiation that has traversed the projection system to measure wave front aberrations of the projection system.

2. A lithographic projection apparatus according to claim 1, wherein said sensor module is configured to measure wave front aberrations of the projection system.

3. A lithographic projection apparatus according to claim 1, wherein a single member has the function of both the diffractive element and the diffuser structure.

4. A lithographic projection apparatus according to claim 1, wherein the diffractive element comprises a reflective grating in which the reflective portions comprise the diffuser structure.

5. A lithographic projection apparatus according to claim 1, wherein the diffuser structure comprises an array of reflective portions randomly staggered in height.

6. A lithographic projection apparatus according to claim 5, wherein each reflective portion comprises a multilayer structure.

7. A lithographic projection apparatus according to claim 1, wherein the diffuser structure comprises sub-resolution absorptive features.

8. A lithographic projection apparatus according to claim 1, wherein the diffractive element comprises a transmissive grating, and the measurement system further comprises a mirror configured to direct the projection beam to illuminate the grating from behind, wherein the diffuser structure comprises imperfections in the mirror.

9. A lithographic projection apparatus according to claim 8, wherein said mirror is curved to provide a focusing effect.

10. A lithographic projection apparatus according to claim 1, wherein the diffractive element comprises a transmissive grating, and the measurement system further comprises a mirror configured to direct the projection beam to illuminate the grating from behind, wherein the mirror is curved to provide a focusing effect and comprises the diffuser structure configured to increase the pupil filling of the radiation in the pupil of the projection system.

11. A lithographic projection apparatus according to claim 8, wherein, in use, the mirror is tilted at an angle relative to the plane of the grating to provide a tilted illumination beam.

12. A lithographic projection apparatus according to claim 10, wherein, in use, the mirror is tilted at an angle relative to the plane of the grating to provide a tilted illumination beam.

13. A lithographic projection apparatus according to claim 1, further comprising at least one Fresnel amplitude zone plate movable into the projection beam configured to focus the beam that reaches the diffractive element.

14. A lithographic projection apparatus according to claim 1, wherein the diffuser structure configured to increase the pupil filling is configured such that the radiation of the measurement system at least substantially fills the pupil of the projection system.

15. A lithographic projection apparatus according to claim 1, wherein the sensor module comprises a further diffractive element, such as a grating, and a radiation sensor, such as a CCD.

16. A lithographic projection apparatus according to claim 1, wherein said projection beam of radiation comprises EUV radiation.

17. A measurement system to measure wave front aberrations of a projection system, said measurement system comprising:
   a diffractive element and a diffuser structure configured to increase pupil filling of radiation in a pupil of the projection system relative to pupil filling of the radiation in the pupil of the projection system attributable to the diffractive element alone, both movable into a projection beam between a radiation system and the projection system; and
   a sensor module configured to sense radiation that has traversed the projection system to measure wave front aberrations of the projection system.

18. A measurement system according to claim 17, wherein the diffractive element comprises a reflective grating in which the reflective portions comprise the diffuser structure.

19. A measurement system according to claim 17, wherein the diffuser structure comprises an array of reflective portions randomly staggered in height.

20. A measurement system according to claim 17, wherein the diffuser structure comprises sub-resolution absorptive features.

21. A measurement system according to claim 17, wherein the diffractive element comprises a transmissive grating, and the measurement system further comprises a mirror configured to direct the projection beam to illuminate the grating from behind, wherein the diffuser structure comprises imperfections in the mirror.

22. A measurement system according to claim 17, wherein the diffractive element comprises a transmissive grating, and the measurement system further comprises a mirror configured to direct the projection beam to illuminate the grating from behind, wherein the mirror is curved to provide a focusing effect and comprises the diffuser structure configured to increase the pupil filling of the radiation in the pupil of the projection system.

23. A measurement system according to claim 21, wherein, in use, the mirror is tilted at an angle relative to the plane of the grating to provide a tilted illumination beam.

24. A measurement system according to claim 22, wherein, in use, the mirror is tilted at an angle relative to the plane of the grating to provide a tilted illumination beam.

25. A lithographic projection apparatus comprising:

an illuminator configured to provide a projection beam of radiation;

a support structure configured to hold a patterning device, the patterning device configured to pattern the projection beam according to a desired pattern;

a substrate table configured to hold a substrate;

a projection system configured to project the patterned beam onto a target portion of the substrate; and a measurement system configured to measure defocus of the apparatus, comprising a transmissive grating and a mirror configured to direct the projection beam to illuminate the grating from behind, wherein, in use, the mirror is tilted at an angle relative to the plane of the grating to provide a tilted illumination beam.

26. A lithographic projection apparatus according to claim 25, wherein the mirror is at least one of plane and curved.

27. A lithographic projection apparatus according to claim 25, wherein the mirror is adjustably tiltable by means of an actuator.

28. A lithographic projection apparatus according to claim 25, wherein said projection beam comprises EUV radiation.

29. A measurement system according to claim 17, further comprising at least one Fresnel amplitude zone plate movable into the projection beam configured to focus the beam that reaches the diffractive element.

* * * * *